(12) United States Patent
Miyairi et al.

(10) Patent No.: US 8,772,752 B2
(45) Date of Patent: Jul. 8, 2014

(54) SEMICONDUCTOR DEVICE

(75) Inventors: Hidekazu Miyairi, Atsugi (JP); Atsushi Hirose, Isehara (JP); Yoshitaka Yamamoto, Osaka (JP); Tomohiro Kimura, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 127 days.

(21) Appl. No.: 13/477,373

(22) Filed: May 22, 2012

(65) Prior Publication Data
US 2012/0299006 A1 Nov. 29, 2012

(30) Foreign Application Priority Data
May 24, 2011 (JP) ................... 2011-116175

(51) Int. Cl.
*H01L 47/00* (2006.01)
(52) U.S. Cl.
USPC .. 257/4; 257/2; 257/49; 257/59; 257/E29.151
(58) Field of Classification Search
USPC ............ 257/1, 2, 3, 4, 5, 49, 59, 72, E29.151
See application file for complete search history.

(56) References Cited

U.S. PATENT DOCUMENTS

| | | | |
|---|---|---|---|
| 5,712,495 A | | 1/1998 | Suzawa |
| 5,866,919 A | * | 2/1999 | Kwon et al. ................... 257/59 |
| 7,081,938 B1 | | 7/2006 | Yamazaki et al. |
| 7,211,825 B2 | | 5/2007 | Shih et al |
| 2008/0230179 A1 | | 9/2008 | Ishitani et al. |
| 2009/0001375 A1 | | 1/2009 | Yamazaki et al. |
| 2009/0146967 A1 | * | 6/2009 | Ino et al. ....................... 345/173 |
| 2012/0200546 A1 | * | 8/2012 | Miyamoto et al. ............ 345/205 |

FOREIGN PATENT DOCUMENTS

| | | |
|---|---|---|
| JP | 5-150262 | 6/1993 |
| JP | 2008-268923 | 11/2008 |

* cited by examiner

*Primary Examiner* — Eduardo A Rodela
(74) *Attorney, Agent, or Firm* — Eric J. Robinson; Robinson Intellectual Property Law Office, P.C.

(57) ABSTRACT

An object is to prevent light leakage caused due to misregistration even when the width of a black matrix layer is not expanded to a designed value or larger. One embodiment of the present invention is a semiconductor device including a single-gate thin film transistor in which a first semiconductor layer is sandwiched between a bottom-gate electrode and a first black matrix layer. The first semiconductor layer and the first black matrix layer overlap with each other.

6 Claims, 5 Drawing Sheets

SEMICONDUCTOR DEVICE

BACKGROUND OF THE INVENTION

1. Field of the Invention

The present invention relates to a semiconductor device, a liquid crystal display device, and the like. Note that in this specification, a semiconductor device refers to a semiconductor element itself or a device including a semiconductor element. As an example of such a semiconductor element, for example, a transistor (a thin film transistor or the like) can be given. In addition, a semiconductor device also refers to a display device such as a liquid crystal display device.

2. Description of the Related Art

A conventional liquid crystal display device has a structure in which a liquid crystal layer including a liquid crystal material is sandwiched between a substrate including a thin film transistor (also referred to as a thin film transistor (TFT) substrate) and a counter substrate. The TFT substrate has a layered structure in which a glass substrate, a base insulating film, a gate electrode, a gate insulating film, a semiconductor layer, source and drain electrodes, an interlayer insulating film, a pixel electrode, and an alignment film are stacked in this order. The counter substrate has a layered structure in which a glass substrate, a black matrix layer (an organic resin or metal), a color filter, a counter electrode, and an alignment film are stacked in this order.

In order to prevent a thin film transistor provided in a pixel portion on the TFT substrate from being irradiated with light from a backlight or light from the outside, in the liquid crystal display device, the black matrix layer is provided in a region of the counter substrate which overlaps with the thin film transistor.

In addition, in order to improve image quality, in the conventional liquid crystal display device, a black matrix layer is also provided in a region of the counter substrate, which is over a region of the TFT substrate where projections and depressions due to a variety of metal wirings, a holding capacitor, or the like exist.

However, in the case where the black matrix layer is provided on the counter substrate, there is a problem in that light leakage occurs due to misregistration between the counter substrate and the TFT substrate, so that the thin film transistor of the TFT substrate is irradiated with the light.

In addition, when the width of the black matrix layer is extended to a designed value or more in the counter substrate in order to prevent light leakage even if misregistration between the counter substrate and the TFT substrate occurs, the aperture ratio of the pixel portion might be reduced.

In recent years, higher resolution of a liquid crystal display device has been advanced as well as higher-speed driving thereof. Therefore, a display panel having a large number of pixels and displaying a high-resolution image has problems in that adverse effects caused by a load of parasitic capacitance between wirings, a load due to an increase in the number of signal lines, or the like are increased.

REFERENCE

Patent Document

[Patent Document 1] Japanese Published Patent Application No. 2008-268923

SUMMARY OF THE INVENTION

An object of one embodiment of the present invention is to prevent light leakage caused due to misregistration even when the width of a black matrix layer is not expanded to a designed value or larger. Another object of one embodiment of the present invention is to reduce parasitic capacitance between wirings. Another object of one embodiment of the present invention is to reduce an adverse effect of a load accompanying an increase in the number of signal lines.

One embodiment of the present invention is a semiconductor device including a single-gate thin film transistor in which a first semiconductor layer is sandwiched between a bottom-gate electrode and a first black matrix layer. The first semiconductor layer and the first black matrix layer overlap with each other.

The semiconductor device according to one embodiment of the present invention preferably includes a first capacitor including a first capacitor electrode, a first insulating film, and a second capacitor electrode; and a second capacitor including the second capacitor electrode, a second insulating film, and a third capacitor electrode. The first capacitor and the second capacitor preferably overlap with each other. The first capacitor electrode and the third capacitor electrode are preferably electrically connected to each other. The first capacitor electrode is preferably formed of the same layers as the bottom-gate electrode. The third capacitor electrode is preferably formed of a second black matrix layer which is the same layer as the first black matrix layer.

In the semiconductor device according to one embodiment of the present invention, the first black matrix layer may be formed so as to surround the third capacitor electrode and may be electrically isolated from the third capacitor electrode.

The semiconductor device according to one embodiment of the present invention preferably further includes a second semiconductor layer in a portion where a first wiring electrically connected to the third capacitor electrode and a second wiring electrically connected to one electrode of a source and a drain of the thin film transistor intersect each other. The second wiring in the portion is preferably formed of a third black matrix layer which is the same layer as the first black matrix layer. The first wiring is preferably formed of the same layer as the bottom-gate electrode. The second semiconductor layer and the third black matrix layer preferably overlap with each other. The second semiconductor layer is preferably the same layer as the first semiconductor layer.

In the semiconductor device according to one embodiment of the present invention, the bottom-gate electrode is preferably formed of a conductive film having a larger area than the first semiconductor layer.

Another embodiment of the present invention is a semiconductor device including a single-gate thin film transistor. The single-gate thin film transistor includes a bottom-gate electrode; a first insulating film formed over the bottom-gate electrode; a first semiconductor layer formed over the first insulating film; a second insulating film formed over the first semiconductor layer; and a first black matrix layer formed over the second insulating film. The first semiconductor layer and the first black matrix layer overlap with each other.

The semiconductor device according to one embodiment of the present invention may further include a first capacitor including a first capacitor electrode, the first insulating film, and a second capacitor electrode; and a second capacitor including the second capacitor electrode, the second insulating film, and a third capacitor electrode. The first capacitor and the second capacitor may overlap with each other. The first capacitor electrode and the third capacitor electrode may be electrically connected to each other. The first capacitor electrode may be formed of the same layer as the bottom-gate electrode. The third capacitor electrode may be formed of a second black matrix layer which is the same layer as the first black matrix layer. The first black matrix layer may be formed so as to surround the third capacitor electrode and may be electrically isolated from the third capacitor electrode.

The semiconductor device according to one embodiment of the present invention preferably further includes a first wiring which is formed below the first insulating film and is electrically connected to the third capacitor electrode; and a second wiring which is formed over the first insulating film, is electrically connected to one electrode of a source and a drain of the thin film transistor, and intersects the first wiring. A portion where the first wiring and the second wiring intersect each other preferably includes the first insulating film formed over the first wiring, a second semiconductor layer formed over the first insulating film, the second insulating film formed over the second semiconductor layer, and the second wiring formed over the second insulating film. The second wiring in the portion is preferably formed of a third black matrix layer which is the same layer as the first black matrix layer. The second semiconductor layer and the third black matrix layer preferably overlap with each other. The first wiring is preferably formed of the same layer as the bottom-gate electrode.

The semiconductor device according to one embodiment of the present invention preferably further includes the other electrode of the source and the drain, which is electrically connected to the first semiconductor layer; a fourth black matrix layer which is formed over the second insulating film and through which the other electrode and the second capacitor electrode are electrically connected to each other; and a third semiconductor layer which is arranged between the fourth black matrix layer and the bottom-gate electrode and is formed between the first insulating film and the second insulating film. The third semiconductor layer and the fourth black matrix layer preferably overlap with each other.

The semiconductor device according to one embodiment of the present invention preferably further includes the one electrode of the source and the drain, which is electrically connected to the first semiconductor layer; a third wiring formed over the first insulating film; a fifth black matrix layer which is formed over the second insulating film and through which the one electrode and the third wiring are electrically connected to each other; and a fourth semiconductor layer which is arranged between the fifth black matrix layer and the bottom-gate electrode and which is formed between the first insulating film and the second insulating film. The fourth semiconductor layer and the fifth black matrix layer preferably overlap with each other.

Another embodiment of the present invention is a semiconductor device including a first wiring; and a second wiring intersecting the first wiring. A portion where the first wiring and the second wiring intersect each other includes a first insulating film formed over the first wiring, a first semiconductor layer formed over the first insulating film, a second insulating film formed over the first semiconductor layer, and the second wiring formed over the second insulating film. The second wiring is formed of a first black matrix layer. The first black matrix layer and the first semiconductor layer overlap with each other.

In the semiconductor device according to one embodiment of the present invention, the second wiring is preferably electrically connected to one electrode of a source and a drain of a thin film transistor.

The semiconductor device according to one embodiment of the present invention preferably further includes a third wiring through which the one electrode and the second wiring are electrically connected to each other; and a second semiconductor layer arranged between the third wiring and a bottom-gate electrode of the thin film transistor. The third wiring is preferably formed of a second black matrix layer.

The semiconductor device according to one embodiment of the present invention preferably further includes a signal line sharing circuit which divides one signal into a plurality of signals and supplies the plurality of signals to a plurality of wirings. Any of the plurality of signals into which the one signal is divided by the signal line sharing circuit is preferably supplied to the first wiring or the second wiring.

The semiconductor device according to one embodiment of the present invention preferably further includes a signal line sharing circuit including a first transistor; a second transistor; a third transistor; a fourth wiring into which one signal is input and which is electrically connected to one first electrode of a source and a drain of the first transistor, one second electrode of a source and a drain of the second transistor, and one third electrode of a source and a drain of the third transistor; a fifth wiring which is electrically connected to a gate electrode of the first transistor and to which a signal for controlling the first transistor is input; a sixth wiring which is electrically connected to a gate electrode of the second transistor and to which a signal for controlling the second transistor is input; and a seventh wiring which is electrically connected to a gate electrode of the third transistor and to which a signal for controlling the third transistor is input. The first wiring or the second wiring is preferably electrically connected to any of the other first electrode of the source and the drain of the first transistor, the other second electrode of the source and the drain of the second transistor, and the other third electrode of the source and the drain of the third transistor.

According to one embodiment of the present invention, light leakage caused due to misregistration can be prevented even when the width of a black matrix layer is not wider than necessary. Further, according to one embodiment of the present invention, parasitic capacitance between wirings can be reduced. Furthermore, according to one embodiment of the present invention, an adverse effect of a load accompanying an increase in the number of signal lines can be reduced.

DETAILED DESCRIPTION OF THE INVENTION

Hereinafter, embodiments of the present invention will be described in detail with reference to the drawings. Note that the present invention is not limited to the following description, and it is easily understood by those skilled in the art that the mode and details can be variously changed without departing from the scope and spirit of the present invention. Therefore, the present invention should not be construed as being limited to the description in the following embodiments.

Embodiment 1

A liquid crystal display device according to one embodiment of the present invention will be described with reference to FIG. 1 and FIGS. 2A to 2C.

The liquid crystal display device according to one embodiment of the present invention has a structure in which a liquid crystal layer including a liquid crystal material is sandwiched between a TFT substrate and a counter substrate. A TFT substrate illustrated in FIG. 1 and FIGS. 2A to 2C has a layered structure in which a glass substrate, an underlayer film, a gate electrode, a gate insulating film, a semiconductor layer, a source electrode and a drain electrode, a transparent electrode, an interlayer insulating film, a black matrix layer, and an alignment film are stacked in this order. In this manner, the black matrix layer is provided on the TFT substrate side that is a backlight side; thus, light from the backlight can be efficiently blocked and light leakage due to misregistration can be reduced. A counter substrate has a layered structure in which a glass substrate, a coloring film, a protective film, a counter electrode, and an alignment film are stacked in this order. Note that although the glass substrate is used as the substrate in this embodiment, another substrate may be used.

Figure 1:
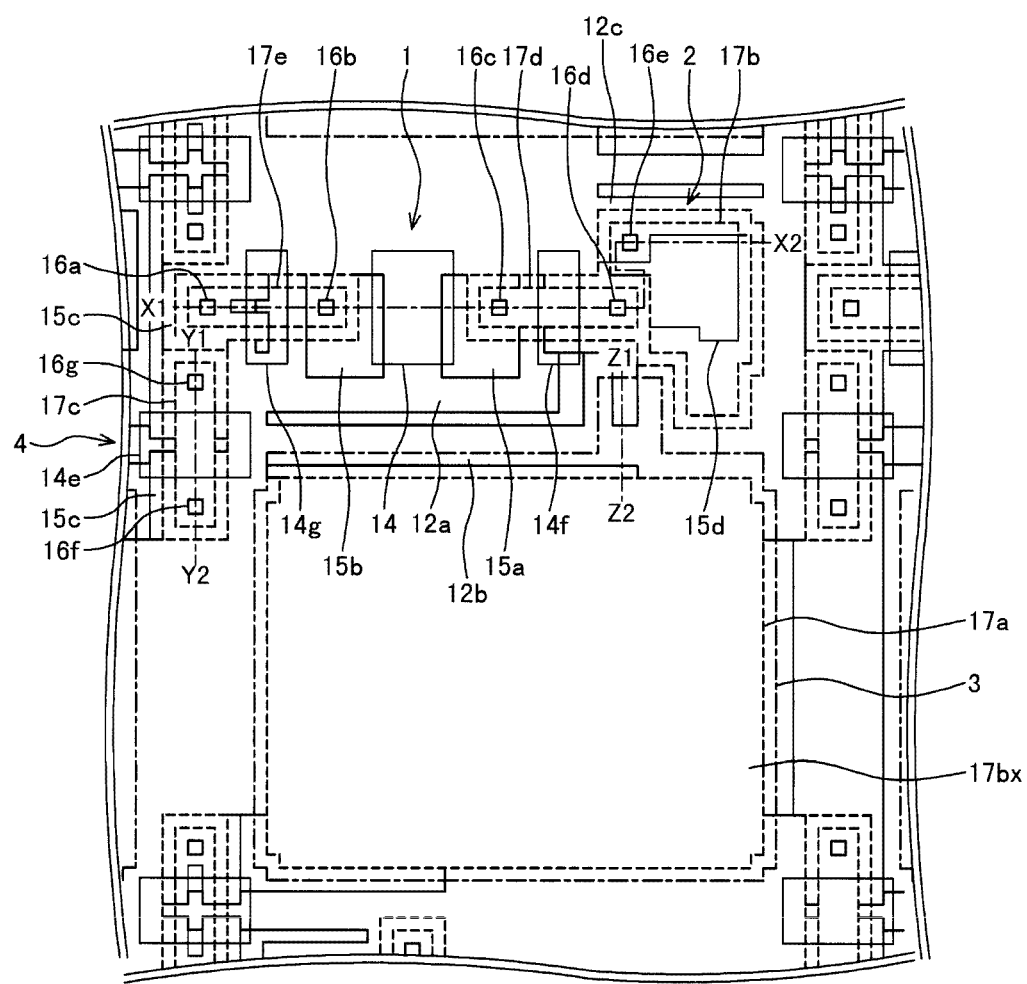
FIG. 1 is a plan view illustrating a TFT substrate of a liquid crystal display device according to one embodiment of the present invention.

The TFT substrate illustrated in FIG. 1 includes a thin film transistor 1, a holding capacitor 2, a wiring intersection portion 4, and a pixel electrode 3.

Figure 2A:
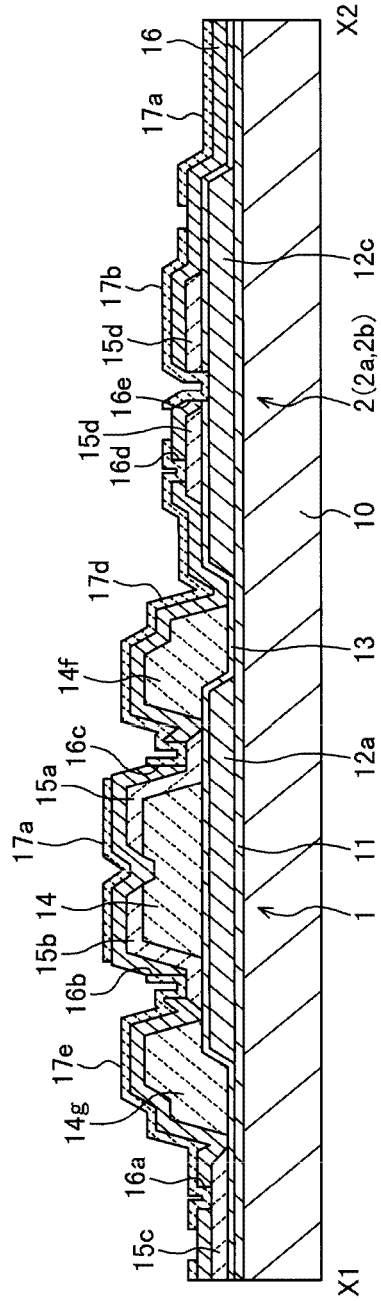
FIG. 2A is a cross-sectional view taken along line X1-X2 of FIG. 1.

First, the thin film transistor 1 and the holding capacitor 2 will be described. As illustrated in FIG. 2A, the thin film transistor 1 and the holding capacitor 2 are formed over a glass substrate 10 provided with an underlayer film 11. The holding capacitor 2 includes a first capacitor 2a and a second capacitor 2b. Note that the underlayer film 11 is not necessarily provided; the glass substrate 10 which is not provided with the underlayer film 11 may be used.

The details are described below. A bottom-gate electrode 12a and a first capacitor electrode 12c are formed over the underlayer film 11. The bottom-gate electrode 12a and the first capacitor electrode 12c are formed of a first conductive film, and are electrically connected to each other. The bottom-gate electrode 12a also serves as a selection signal line (gate electrode line). An insulating film 13 is formed over the bottom-gate electrode 12a, the first capacitor electrode 12c, and the underlayer film 11. The insulating film 13 over the bottom-gate electrode 12a serves as a gate insulating film. As the gate insulating film, for example, a silicon nitride film can be used. The thickness of the gate insulating film is preferably 300 nm to 400 nm. A semiconductor layer 14 is formed over the insulating film 13 and above the bottom-gate electrode 12a.

One electrode 15a and the other electrode 15b of a source and a drain are formed above the bottom-gate electrode 12a and over the semiconductor layer 14 and the insulating film 13. The thickness of the bottom-gate electrode 12a is substantially the same as that of the one electrode 15a and the other electrode 15b; for example, in the case of a three-layer structure, a layer with a thickness of 50 nm, a layer with a thickness of 100 nm to 300 nm, and a layer with a thickness of 50 nm are formed. Over the insulating film 13, a semiconductor layer 14f and a semiconductor layer 14g are formed next to the one electrode 15a and the other electrode 15b, respectively. A wiring 15c is formed over the insulating film 13 and next to the semiconductor layer 14g. A second capacitor electrode 15d is formed over the insulating film 13 and above the first capacitor electrode 12c. The first capacitor 2a includes the first capacitor electrode 12c and the second capacitor electrode 15d. The one electrode 15a and the other electrode 15b of the source and the drain, the wiring 15c, and the second capacitor electrode 15d are formed of a second conductive film.

A passivation layer (insulating film) 16 is formed over the wiring 15c, the semiconductor layers 14, 14g, and 14f, the one electrode 15a and the other electrode 15b of the source and the drain, and the second capacitor electrode 15d. Contact holes 16a to 16g are formed in the passivation layer 16. The contact hole 16e reaches a layer formed of the first conductive film (see FIG. 1 and FIG. 2A). Note that the passivation layer can be formed using a silicon nitride layer, and preferably has a thickness of 150 nm to 400 nm.

A fifth black matrix layer 17e is formed above the semiconductor layer 14g and over the passivation layer 16. The semiconductor layer 14g and the fifth black matrix layer 17e overlap with each other. The fifth black matrix layer 17e is electrically connected to the wiring 15c through the contact hole 16a, and is electrically connected to the other electrode 15b of the source and the drain through the contact hole 16b. The semiconductor layer 14g is arranged between the fifth black matrix layer 17e and the bottom-gate electrode 12a. With the semiconductor layer 14g, the distance between the fifth black matrix layer 17e and the bottom-gate electrode 12a is made longer; thus, the parasitic capacitance between the fifth black matrix layer 17e and the bottom-gate electrode 12a can be reduced.

A first black matrix layer 17a is formed over the passivation layer 16 so as to surround the fifth black matrix layer 17e (see FIG. 1 and FIG. 2A). The fifth black matrix layer 17e is electrically isolated from the first black matrix layer 17a, and the fifth black matrix layer 17e and the first black matrix layer 17a are formed of the same layer.

A fourth black matrix layer 17d is formed above the semiconductor layer 14f and over the passivation layer 16. The semiconductor layer 14f and the fourth black matrix layer 17d overlap with each other. The fourth black matrix layer 17d is electrically connected to the one electrode 15a of the source and the drain through the contact hole 16c, and is electrically connected to the second capacitor electrode 15d through the contact hole 16d. The semiconductor layer 14f is arranged between the fourth black matrix layer 17d and the bottom-gate electrode 12a. With the semiconductor layer 14f, the distance between the fourth black matrix layer 17d and the bottom-gate electrode 12a is made longer; thus, the parasitic capacitance between the fourth black matrix layer 17d and the bottom-gate electrode 12a can be reduced.

The fourth black matrix layer 17d is surrounded by the first black matrix layer 17a (see FIG. 1 and FIG. 2A). The fourth black matrix layer 17d is electrically isolated from the first black matrix layer 17a, and the fourth black matrix layer 17d and the first black matrix layer 17a are formed of the same layer.

A second black matrix layer 17b is formed above the second capacitor electrode 15d and over the passivation layer 16. The second black matrix layer 17b is electrically connected to the first capacitor electrode 12c through the contact hole 16e (see FIG. 1). The second black matrix layer 17b serves as a third capacitor electrode. Thus, the second capacitor 2b includes the second capacitor electrode 15d and the third capacitor electrode (the second black matrix layer 17b). The holding capacitor 2 includes the second capacitor 2b and the first capacitor 2a. Since the first capacitor 2a and the second capacitor 2b overlap with each other, the capacitance can be increased with a small area.

The second black matrix layer 17b is surrounded by the first black matrix layer 17a (see FIG. 1 and FIG. 2A). The second black matrix layer 17b is electrically isolated from the first black matrix layer 17a, and the second black matrix layer 17b and the first black matrix layer 17a are formed of the same layer.

As illustrated in FIG. 1 and FIG. 2A, the area of the semiconductor layer 14 of the thin film transistor 1 is smaller than that of the bottom-gate electrode 12a, and the semiconductor layer 14 is covered with the first black matrix layer 17a, the passivation layer 16, and the one electrode 15a and the other electrode 15b of the source and the drain. The semiconductor layer 14 and the first black matrix layer 17a overlap with each other.

According to this embodiment, the semiconductor layer 14 is covered with the first black matrix layer 17a so that light from the outside can be prevented from unintentionally entering the semiconductor layer 14 of the thin film transistor.

Further, according to this embodiment, the first to fifth black matrix layers 17a to 17e are arranged over the passivation layer 16 so that generation of light leakage due to misregistration between the TFT substrate and the counter substrate can be prevented.

Figure 2C:
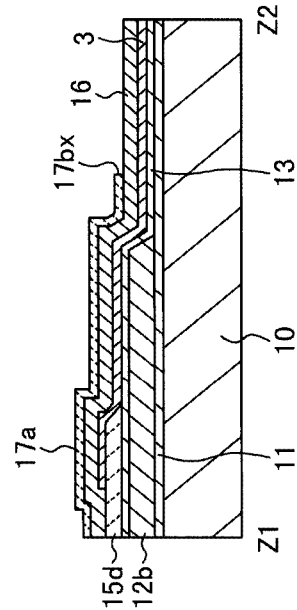
FIG. 2C is a cross-sectional view taken along line Z1-Z2 of FIG. 1.
Figure 2B:
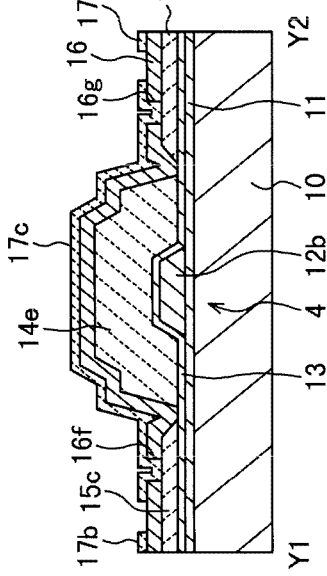
FIG. 2B is a cross-sectional view taken along line Y1-Y2 of FIG. 1.

Next, the wiring intersection portion 4 and the pixel electrode 3 will be described. The wiring intersection portion 4 and the pixel electrode 3 are, as illustrated in FIGS. 2B and 2C, formed over the glass substrate 10 provided with the underlayer film 11. With an opening 17bx in the first black matrix layer 17a, part of the pixel electrode 3 is exposed through the passivation layer 16. Note that the passivation layer 16 in the opening 17bx is not necessarily provided. The layered structure is not limited to the one illustrated in FIGS. 2A to 2C, and the pixel electrode 3 may be provided over the passivation layer 16.

In the wiring intersection portion 4 of FIG. 2B, a wiring 12b is a capacitor line formed of the first conductive film, and the wiring 15c is a video signal line formed of the second conductive film. The wiring (capacitor line) 12b is electrically connected to the first capacitor electrode 12c.

In the wiring intersection portion 4 of the video signal line (wiring) 15c and the capacitor line (wiring) 12b illustrated in FIG. 1, parasitic capacitance is generated and thus a signal transmitted through the video signal line is delayed. From this reason, in this embodiment, the video signal lines 15c are separate from each other in a region where they overlap with the capacitor line 12b as illustrated in FIG. 2B. The video signal lines 15c which are separate from each other are connected through a wiring formed of a third black matrix layer 17c. In order to further reduce the parasitic capacitance between the capacitor line 12b and the wiring 17c (third black matrix layer), the distance between the capacitor line 12b and the wiring 17c is made long by providing the insulating film 13, a semiconductor layer 14e, and the passivation layer 16 between the capacitor line 12b and the wiring 17c (third black matrix layer).

A problem of parasitic capacitance generated in the wiring intersection portion is described. The parasitic capacitance generated not only in the above-described wiring intersection portion 4 but also in another wiring intersection portion (not illustrated) leads to a problem. For example, a selection signal is delayed due to the parasitic capacitance between the video signal line and the selection signal line (gate electrode line). In the intersection portion of the video signal line and the selection signal line, parasitic capacitance is generated. As for a selection signal input to the selection signal line, the longer the distance from an input terminal of the selection signal is, the more increased a CR delay is. Consequently, the waveform of the selection signal is distorted, and a voltage does not have a value large enough to select a desired pixel with the selection signal; thus, an accurate signal cannot be transmitted to a pixel. As a result, the length of a charging period becomes insufficient, and the image quality is deteriorated.

In addition, since the video signal line intersects (extends beyond) the selection signal line and the capacitor line alternately, the parasitic capacitances at the intersection portions with the selection signal line and the capacitor line cause CR delay in the waveform of the signal which is to be input to the video signal line, thereby causing the distortion of the waveform of the video signal. As a result, there is not enough charge capacity (current), so that the image quality deteriorates. In this manner, when an intersection portion of wirings in which a parasitic capacitance is desirably reduced has a structure similar to that in FIG. 2B, the parasitic capacitance between the wirings can be reduced. The selection signal line and the capacitor line are arranged alternately in FIG. 1; however, the pixel structure of a display device according to one embodiment of the present invention is not limited to this, and the selection signal line and the capacitor line are not necessarily arranged alternately.

The wiring intersection portion 4 and the pixel electrode 3 are described below in detail. In FIGS. 2B and 2C, the capacitor line 12b is formed over the underlayer film 11, and is formed of the first conductive film. The insulating film 13 is formed over the capacitor line 12b and the underlayer film 11, and the semiconductor layer 14e is formed over the insulating film 13. The semiconductor layer 14e is formed of the same layer as the semiconductor layers 14, 14f, and 14g illustrated in FIG. 2A. The video signal lines 15c are formed over the insulating film 13, and are formed of the second conductive film. Over the insulating film 13 and the second capacitor electrode 15d, the pixel electrode 3 formed of a transparent electrode is provided. The pixel electrode 3 is electrically connected to the second capacitor electrode 15d. Over the pixel electrode 3, the video signal line 15c, the semiconductor layer 14e, and the insulating film 13, the passivation layer 16 is formed. The contact holes 16f and 16g are formed in the passivation layer 16, and the third black matrix layer (wiring) 17c is formed in the contact holes 16f and 16g and over the passivation layer 16. Accordingly, the video signal lines 15c are electrically connected to each other through the wiring 17c. The third black matrix layer (wiring) 17c is surrounded by the first black matrix layer 17a, and is electrically isolated from the first black matrix layer 17a. The third black matrix layer 17c is formed of the same layer as the first black matrix layer 17a. The third black matrix layer 17c and the semiconductor layer 14e overlap with each other.

As illustrated in FIG. 1 and FIGS. 2A to 2C, part of the one electrode 15a of the source and the drain, part of the other electrode 15b of the source and the drain, part of the second capacitor electrode 15d, and part of the video signal line (wiring) 15c, which are positioned below regions between the first black matrix layer 17a and the second to fifth black matrix layers 17b to 17e, are exposed through the passivation layer 16. These exposed regions are preferably subjected to surface modification treatment in order to reduce glare of the liquid crystal display device so that the reflectivity is reduced. Accordingly, light can be prevented from being reflected unintentionally.

According to this embodiment, the parasitic capacitance can be reduced in the intersection portion of the video signal line (wiring) 15c and the capacitor line (wiring) 12b illustrated in FIG. 2B and FIG. 1, and thus a liquid crystal display device capable of high-speed operation can be manufactured.

The first conductive film for forming the bottom-gate electrode 12a and the like can be formed in the following manner: a conductive film is formed over the underlayer film 11 by a sputtering method, a vacuum evaporation method, or the like using, for example, a metal material such as Mo, Ti, Cr, Ta, W, Al, Cu, Nd, Sc, or Ni; a mask is formed over the conductive film by a photolithography method; and the conductive film is etched using the mask. The underlayer film 11 may be formed using a nitride layer of any of the above metal materials in order to improve the adhesion between the bottom-gate electrode 12a and the glass substrate 10. Note that the first conductive film may have either a single-layer structure or a layered structure.

A side surface of the first conductive film is preferably tapered in order to prevent the insulating film 13 and the like formed over the bottom-gate electrode 12a in later steps from being cut at a step portion of the bottom-gate electrode 12a. In order to taper the side surface of the bottom-gate electrode 12a, etching may be performed while the resist mask is made to recede.

The insulating films 13 and 16 each can be formed as a single layer or a stacked layer using a silicon nitride film, a silicon nitride oxide film, and/or a silicon oxynitride film by a CVD method.

The second conductive film for forming the one electrode 15a and the other electrode 15b of the source and the drain and the like can be formed in the following manner: a conductive film is formed using any of metal materials such as Al, Cu, Ti, Nd, Sc, Mo, Cr, Ta, Ni, and W; a mask is formed over the conductive film by a photolithography method; and the conductive film is etched using the mask. Note that the second conductive film may have either a single-layer structure or a layered structure.

The first to fifth black matrix layers 17a to 17e include a metal, and can be formed using any of metal materials such as Ti, Cr, Al, Ta, Mo, and Ni, for example. Note that the first to fifth black matrix layers 17a to 17e may have either a single-layer structure or a layered structure.

Figure 3A:
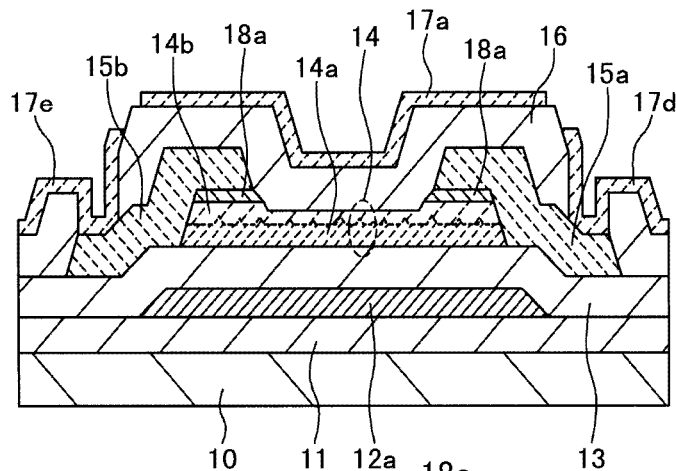
FIG. 3A is a cross-sectional view of a thin film transistor in which a semiconductor layer 14 includes a microcrystalline silicon region 14a and an amorphous silicon region 14b.
Figure 3B:
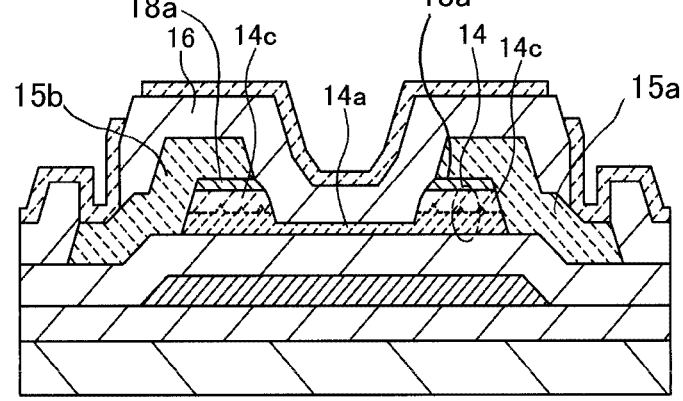
FIG. 3B is a cross-sectional view of a thin film transistor in which the semiconductor layer 14 includes the microcrystalline silicon region 14a and a pair of amorphous silicon regions 14c.

Any of an amorphous semiconductor layer, a microcrystalline semiconductor layer, and a crystalline semiconductor layer may be used for the semiconductor layers 14, 14e, 14f, and 14g. Two examples of the semiconductor layers 14, 14e, 14f, and 14g are illustrated in FIGS. 3A and 3B. FIG. 3A is a cross-sectional view of a thin film transistor in which the semiconductor layer 14 includes a microcrystalline silicon region 14a and an amorphous silicon region 14b. FIG. 3B is a cross-sectional view of a thin film transistor in which the semiconductor layer 14 includes the microcrystalline silicon region 14a and a pair of amorphous silicon regions 14c.

As illustrated in FIG. 3A, the microcrystalline silicon region 14a is formed over the insulating film 13, and the amorphous silicon region 14b is formed over the microcrystalline silicon region 14a. Impurity silicon films 18a are formed over the amorphous silicon region 14b.

Figure 3C:
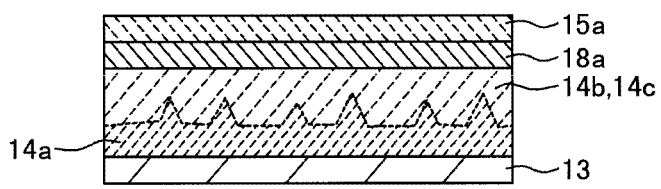
FIGS. 3C and 3D are each an enlarged view of a portion between an insulating film 13 and one electrode 15a of a source and a drain of FIG. 2A.
Figure 3D:
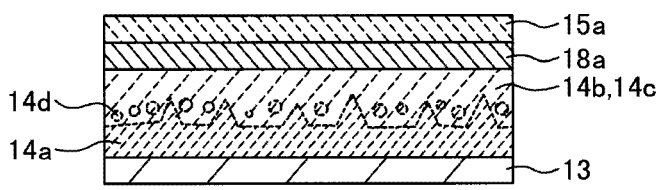

FIGS. 3C and 3D are enlarged views each illustrating a portion between the insulating film 13 and the one electrode 15a of the source and the drain in FIG. 3A. As illustrated in FIG. 3C, part of the microcrystalline silicon region 14a, which is close to the amorphous silicon region 14b, is uneven, and a projecting portion has a projecting shape (a conical or pyramidal shape) in which the tip portion gets sharper from the insulating film 13 side toward the impurity silicon film 18a side (the tip portion of the projecting portion is acute). Note that the microcrystalline silicon region 14a may have a projecting shape (an inverted conical or pyramidal shape) whose width gets broader from the insulating film 13 side toward the impurity silicon film 18a side.

When the thickness of the microcrystalline silicon region 14a, i.e., the distance between an interface with the insulating film 13 and the tip portion of the projection (the projecting portion) of the microcrystalline silicon region 14a is greater than or equal to 5 nm and less than or equal to 150 nm (preferably, 70 nm), the on-state current of the thin film transistor can be increased.

The amorphous silicon region 14b preferably includes an amorphous semiconductor containing nitrogen. Nitrogen in the amorphous semiconductor containing nitrogen may exist, for example, as an NH group or an $NH_2$ group. The thickness of the amorphous silicon region 14b is preferably 100 nm to 300 nm (more preferably, 60 nm). With such a thickness, off-state current can be reduced.

Amorphous silicon containing nitrogen is a semiconductor having lower Urbach energy that is measured by a constant photocurrent method (CPM) or photoluminescence spectroscopy and lower absorption coefficients originating in defects, as compared to a normal amorphous semiconductor. In other words, as compared to the conventional amorphous semiconductor, the amorphous silicon containing nitrogen is a semiconductor having a well-ordered structure which has few defects and whose tail of a level at a valence band edge is steep. Since the amorphous silicon containing nitrogen has a steep tail of a valence band edge, the band gap is wide and tunnel current does not flow easily. Therefore, when the amorphous silicon region 14b containing nitrogen is provided between the microcrystalline silicon region 14a and the impurity silicon film 18a, the off-state current of the thin film transistor can be reduced. In addition, by providing the amorphous silicon containing nitrogen, the on-state current and the field-effect mobility can be increased. Note that the thickness of the impurity silicon films 18a is preferably 50 nm.

Further, the peak energy of the amorphous silicon containing nitrogen in low-temperature photoluminescence spectrum is higher than or equal to 1.31 eV and lower than or equal to 1.39 eV. Note that the peak region of a spectrum of microcrystalline silicon, which is measured by low-temperature photoluminescence spectroscopy, is higher than or equal to 0.98 eV and lower than or equal to 1.02 eV. Accordingly, the amorphous silicon containing nitrogen is different from microcrystalline silicon.

Further, as illustrated in FIG. 3D, a silicon crystal grain 14d whose grain size is greater than or equal to 1 nm and less than or equal to 10 nm, preferably greater than or equal to 1 nm and less than or equal to 5 nm may be included in the amorphous silicon region 14b, so that the on-state current and the filed-effect mobility can be further increased.

Since the part of the microcrystalline silicon region 14a, which is close to the amorphous silicon region 14b, has the conical or pyramidal shape or the inverted conical or pyramidal shape, resistance in a vertical direction (film thickness direction) at the time when voltage is applied between the source electrode and the drain electrode in an on state, i.e., the resistance of the amorphous silicon region 14b can be lowered. Further, tunnel current does not easily flow because amorphous silicon containing nitrogen that is a well-ordered semiconductor having few defects and a steep tail of a level at a band edge in the valence band is provided between the microcrystalline silicon region 14a and the impurity silicon film 18a. Thus, in the thin film transistor described in this embodiment, the on-state current and the field-effect mobility can be increased and the off-state current can be reduced.

The impurity silicon films 18a are formed using amorphous silicon to which phosphorus is added, microcrystalline silicon to which phosphorus is added, or the like. Alternatively, the impurity silicon films 18a can have a layered structure of amorphous silicon to which phosphorus is added and microcrystalline silicon to which phosphorus is added. In the case of forming a p-channel thin film transistor as a thin film transistor, the impurity silicon films 18a are formed using microcrystalline silicon to which boron is added, amorphous silicon to which boron is added, or the like.

The impurity silicon films 18a are formed in a process chamber of a plasma CVD apparatus, using plasma generated by glow discharge with the use of a mixture of a deposition gas containing silicon, hydrogen, and phosphine (diluted with hydrogen or silane) as a source gas. Amorphous silicon to which phosphorus is added or microcrystalline silicon to which phosphorus is added is formed by dilution of the deposition gas containing silicon with hydrogen. In the case of manufacturing a p-channel thin film transistor, the impurity silicon films 18a may be formed using plasma generated by glow discharge using diborane instead of phosphine.

The one electrode 15a and the other electrode 15b of the source and the drain are formed over the impurity silicon films 18a. The one electrode 15a and the other electrode 15b of the source and the drain are formed in the following manner: a conductive film is formed over the impurity silicon films 18a, and the conductive film is etched using a mask. Note that the one electrode 15a and the other electrode 15b of the source and the drain can be formed using a stacked film in which a Ti layer with a thickness of 50 nm, an Al layer with a thickness of 100 nm to 300 nm, and a Ti layer with a thickness of 50 nm are stacked in this order.

Part of the impurity silicon film and top part of the amorphous silicon region are etched, so that the pair of impurity silicon films 18a functioning as a source region and a drain region is formed, and the amorphous silicon region having a depressed portion is formed (see FIG. 3A).

The insulating film 16 is formed over the one electrode 15a and the other electrode 15b of the source and the drain, the amorphous silicon region 14b, and the insulating film 13. Over the insulating film 16, the first, fourth, and fifth black matrix layers 17a, 17d, and 17e are formed.

As the semiconductor layer 14, the one illustrated in FIG. 3B may also be used. Specifically, part of an impurity silicon film, part of an amorphous silicon region, and part of a microcrystalline silicon region are etched, so that the pair of impurity silicon films 18a functioning as the source region and the drain region, the microcrystalline silicon region 14a, and the pair of amorphous silicon regions 14c are formed. Here, the amorphous silicon region 14c is etched so as to expose the microcrystalline silicon region 14a. Thus, in a region where the semiconductor layer 14 is covered with the one electrode 15a and the other electrode 15b of the source and the drain, the microcrystalline silicon region 14a and the amorphous silicon region 14c are stacked. On the other hand, in a region where the semiconductor layer 14 is not covered with the one electrode 15a and the other electrode 15b of the source and the drain, the microcrystalline silicon region 14a is exposed.

The top layout of a pixel portion needs to be determined in consideration of various factors; thus, FIG. 1, FIGS. 2A to 2C, and FIGS. 3A to 3D are merely examples of a display device of one embodiment of the present invention, and one embodiment of the present invention is not limited thereto.

As one factor to be taken into consideration, the precision of alignment in processing in a manufacturing process is given.

In a manufacturing process of a semiconductor device, a photolithography method is frequently used. In a photolithography method, light exposure is an indispensable step; since the position of the substrate fluctuates due to oscillation of a stage used in light exposure, an appropriate margin needs to be provided in the layout.

On the other hand, the precision of light exposure also needs to be taken into consideration. The precision of light exposure depends on the thickness of a resist mask, the photosensitivity of a resist material, the wavelength of light used in light exposure, and the precision of an optical system.

Since a substrate is placed under circumstances at various temperatures in a manufacturing process of a semiconductor device, thermal expansion (or thermal shrinkage) of the substrate occurs depending on the temperature change. Therefore, the layout needs to be determined in consideration of thermal expansion (or negative thermal expansion) depending on the material of the substrate.

In order to prevent generation of defective contact resistance, it is preferable that an edge portion of the following-mentioned wiring or the like is not located in a contact hole which is provided for establishing electrical continuity between wirings formed of the same layer, wirings formed of different layers, semiconductor layers, a semiconductor layer and a wiring, or a wiring and a wiring formed on another substrate. That is, the layout is determined so that the edge portion thereof is not located in the contact hole and the distance between the edge portion of the contact hole and the edge portion of the wiring is at least approximately the minimum feature size (exposure limit), whereby the occurrence of defective contact resistance can be suppressed. Accordingly, products can be manufactured with high yield.

However, this does not mean that the layout is determined in consideration of only the precision of alignment in processing. The electric characteristics of a transistor, the display characteristics required for a display device, the countermeasure against electrostatic discharge (ESD) in a manufacturing process, the yield, and the like also need to be taken into consideration.

For example, the shorter the channel length of a transistor is, the larger the on-state current becomes; therefore, when the on-state current needs to be high, the channel length of a transistor may be about the minimum feature size (exposure limit).

The width of the wiring is made sufficiently large so as to prevent excess wiring resistance. Note that the space between wirings is set so that a short circuit does not occur due to particles generated in a manufacturing process and interference of signals (such as crosstalk) between a plurality of wirings formed of different layers does not occur.

It is preferable that the top layout design of the pixel portion be determined so that a pattern which is less likely to cause electric field concentration is designed in order to prevent electrostatic breakdown in a manufacturing process. For example, the top layout is preferably determined so that the length of the wiring is short in order to prevent electrostatic breakdown between the patterns caused by static electricity due to an antenna effect in plasma processing. In the case where the length of the wiring led is long, a short-circuit ring is provided on the periphery of the wirings so that the wiring patterns have the same potential; thus, electrostatic breakdown between the patterns can be prevented. Note that the short-circuit ring may be cut when the substrate is cut or assembled.

The layout is determined so that the plurality of layers overlap with each other. For example, the layout is determined as follows: in the case where one portion and a light-blocking layer overlap with each other for light blocking, the critical dimension (CD) loss, the precision of light exposure, and the precision of alignment in processing are taken into consideration so that light blocking for this portion can be performed sufficiently. With such layout, light blocking can be achieved with a structure in which one portion and a light-blocking layer overlap with each other in the resulting product.

Embodiment 2

Another embodiment of the present invention is a semiconductor device in which the number of wirings is reduced by employing a structure where a signal line sharing circuit is mounted on the TFT substrate illustrated in FIG. 1. Note that the details of the TFT substrate illustrated in FIG. 1 are similar to those in this embodiment, and description thereof is omitted in this embodiment.

Figure 4:
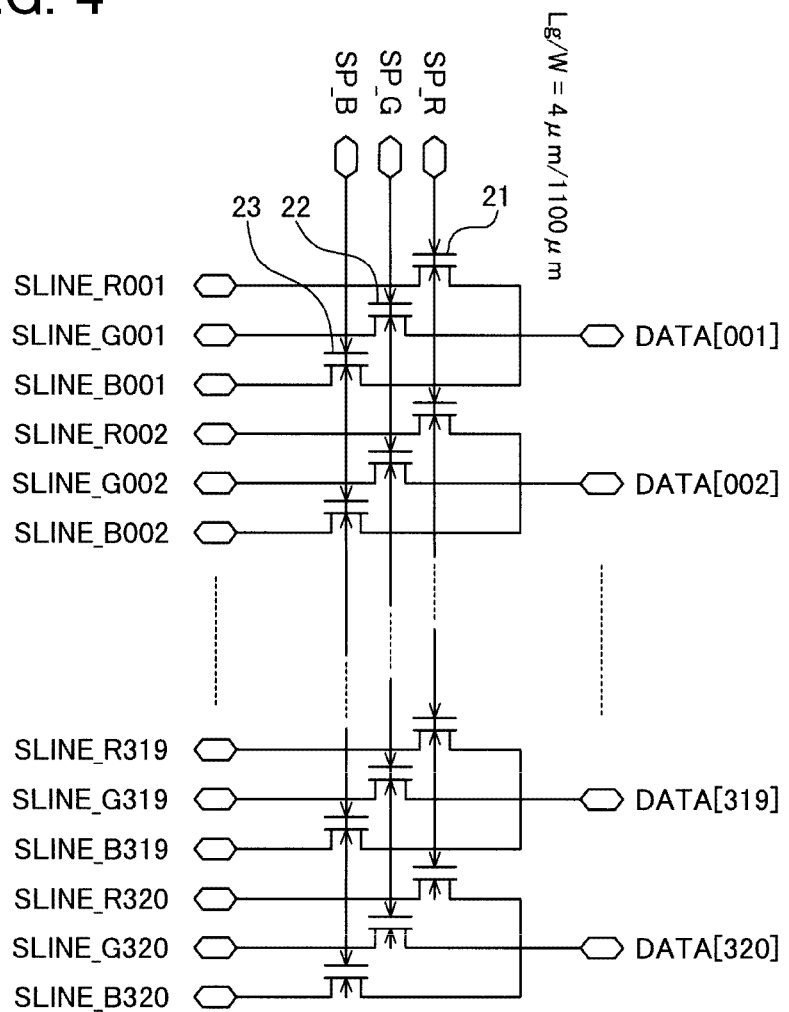
FIG. 4 illustrates a configuration of a signal line sharing circuit.

FIG. 4 illustrates a configuration of a signal line sharing circuit. The signal line sharing circuit is a circuit in which one signal is divided into a plurality of signals at desired time intervals to be supplied to a plurality of signal lines.

Specifically, the signal line sharing circuit includes first to third transistors 21 to 23, and DATA[001] is input to one of a source and a drain of the first transistor 21, one of a source and a drain of the second transistor 22, and one of a source and a drain of the third transistor 23 through wirings.

A gate electrode of the first transistor 21 is electrically connected to SP_R through a wiring, and a signal for controlling the first transistor 21 is input to SPR. A gate electrode of the second transistor 22 is electrically connected to SP_G through a wiring, and a signal for controlling the second transistor 22 is input to SP_G. A gate electrode of the third transistor 23 is electrically connected to SP_B through a wiring, and a signal for controlling the third transistor 23 is input to SP_B.

The other of the source and the drain of the first transistor 21 is electrically connected to SLINE_R001 through a wiring. The other of the source and the drain of the second transistor 22 is electrically connected to SLINE_G001 through a wiring. The other of the source and the drain of the third transistor 23 is electrically connected to SLINE_B001 through a wiring.

With the use of the signal line sharing circuit, for example, one signal of DATA[001] is divided into three signals at time intervals to be supplied as one signal for SLINE_R001, one signal for SLINE_G001, and one signal for SLINE_B001. The same applies to DATA[002] to DATA[320]. Therefore, one signal can be shared by a plurality of signal lines.

Figure 5:
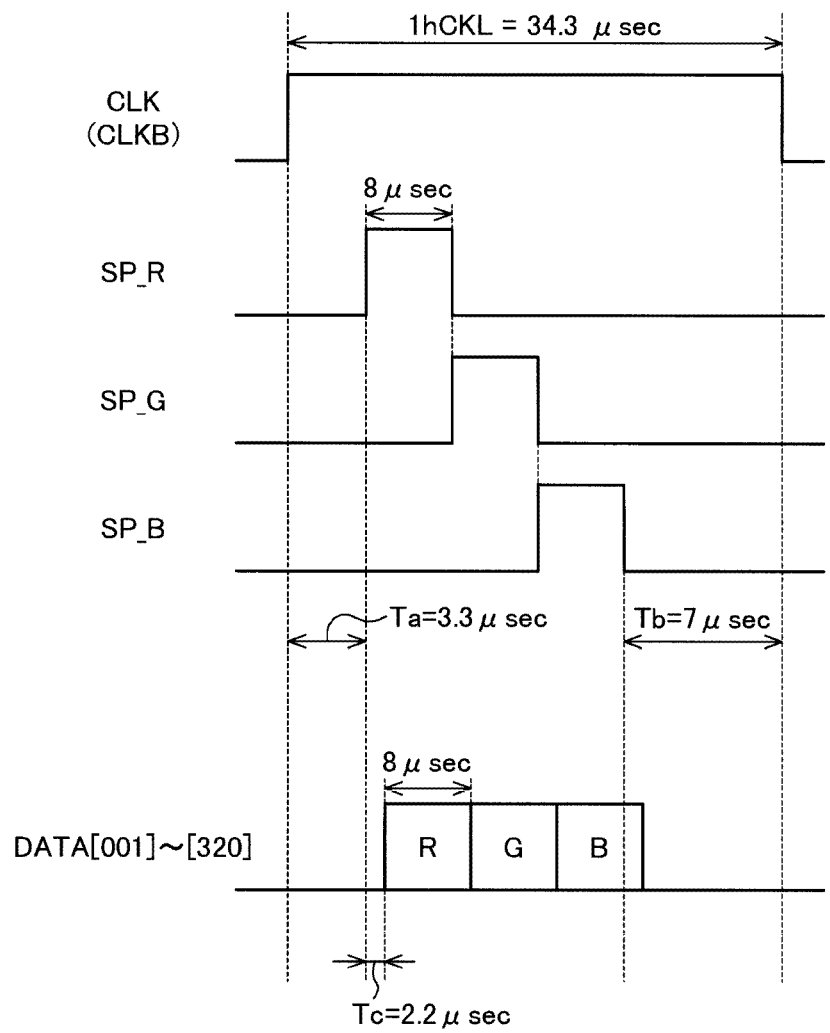
FIG. 5 is a timing chart of the signal line sharing circuit of FIG. 4.

FIG. 5 is a timing chart of the signal line sharing circuit illustrated in FIG. 4. As illustrated in FIG. 4 and FIG. 5, for example, in a period during which SP_R is on, the transistor connected to SLINE_R001 is on and thus a signal is supplied from DATA[001] to SLINE_R001. At this time, since the transistors connected to SLINE_G001 and SLINE_B001 are off, SLINE_G001 and SLINE_B001 are not supplied with a signal.

In a period during which SP_G is on, the transistor connected to SLINE_G001 is on and thus a signal is supplied from DATA[001] to SLINE_G001. At this time, since the transistors connected to SLINE_R001 and SLINE_B001 are off, SLINE_R001 and SLINE_B001 are not supplied with a signal and thus have their original signals.

In a period during which SP_B is on, the transistor connected to SLINE_B001 is on and thus a signal is supplied from DATA[001] to SLINE_B001. At this time, since the transistors connected to SLINE_R001 and SLINE_G001 are off, SLINE_R001 and SLINE_G001 are not supplied with a signal and thus have their original signals.

The signal line is shared by a plurality of components in this manner, whereby the number of wirings can be reduced. With the use of the signal line sharing circuit illustrated in FIG. 4, the number of wirings can be reduced to a third of that in a conventional semiconductor device.

Note that when a signal line is shared by a plurality of components in this manner, signals to be input to respective pixels of RGB are each divided at time intervals (24 μsec in FIG. 5) so as to be sequentially input to the respective pixels of RGB. Therefore, in the case where the periods for inputting signals to all the pixels of RGB are the same, the period for inputting a signal to one pixel (e.g., R) becomes one third or less (8 μsec in FIG. 5). This means that the speed in inputting the signal needs to be three times or more.

FIG. 5 also illustrates a delay (2.2 μsec in FIG. 5) due to parasitic capacitance hanging on the signal line in a period for selecting the signals. Therefore, a net period during which the signals can be effectively used is decreased by the delay due to parasitic capacitance of the signal line. In a high-resolution liquid crystal display device with a large number of pixels, each of the periods for inputting signals to signal lines is short, and such a signal delay is too large to ignore in some cases. In a liquid crystal display device with a larger number of pixels in which the period of signal delay time is longer than or equal to the period for inputting signals to the signal lines, signals are not input properly. From such reasons, in a high-resolution liquid crystal display device with a large number of pixels, it is significantly important to reduce the parasitic capacitance of a signal line.

In view of this, in this embodiment, the signal line sharing circuit illustrated in FIG. 4 is combined with one embodiment of the present invention described in Embodiment 1. With such a structure, even when a signal line is shared by a plurality of components for reducing the number of wirings, the parasitic capacitance between wirings can be reduced and thus a signal delay due to the parasitic capacitance of the signal line can be reduced. As a result, even in the case of a high-resolution liquid crystal display device with a large number of pixels, an adverse effect due to a load accompanying an increase in the number of signal lines can be reduced.

Note that the above-described signal line corresponds to, for example, the video signal lines 15c illustrated in FIG. 1 and FIGS. 2A to 2C.

This application is based on Japanese Patent Application serial no. 2011-116175 filed with Japan Patent Office on May 24, 2011, the entire contents of which are hereby incorporated by reference.

What is claimed is:
1. A semiconductor device comprising:
a first wiring; and
a second wiring intersecting the first wiring,
wherein a portion where the first wiring and the second wiring intersect each other includes a first insulating film formed over the first wiring, a first semiconductor layer formed over the first insulating film, a second insulating film formed over the first semiconductor layer, and the second wiring formed over the second insulating film,
wherein the second wiring is formed of a first black matrix layer, and
wherein the first black matrix layer and the first semiconductor layer overlap with each other.
2. The semiconductor device according to claim 1,
wherein the second wiring is electrically connected to one electrode of a source and a drain of a thin film transistor.

3. The semiconductor device according to claim 2, further comprising:
- a third wiring through which the one electrode and the second wiring are electrically connected to each other; and
- a second semiconductor layer arranged between the third wiring and a bottom-gate electrode of the thin film transistor,
- wherein the third wiring is formed of a second black matrix layer.

4. The semiconductor device according to claim 1, further comprising:
- a signal line sharing circuit which divides one signal into a plurality of signals and supplies the plurality of signals to a plurality of wirings,
- wherein any of the plurality of signals into which the one signal is divided by the signal line sharing circuit is supplied to the first wiring or the second wiring.

5. The semiconductor device according to claim 1, further comprising a signal line sharing circuit including:
- a first transistor;
- a second transistor;
- a third transistor;
- a fourth wiring into which one signal is input and which is electrically connected to one first electrode of a source and a drain of the first transistor, one second electrode of a source and a drain of the second transistor, and one third electrode of a source and a drain of the third transistor;
- a fifth wiring which is electrically connected to a gate electrode of the first transistor and to which a signal for controlling the first transistor is input;
- a sixth wiring which is electrically connected to a gate electrode of the second transistor and to which a signal for controlling the second transistor is input; and
- a seventh wiring which is electrically connected to a gate electrode of the third transistor and to which a signal for controlling the third transistor is input,
- wherein the first wiring or the second wiring is electrically connected to any of the other first electrode of the source and the drain of the first transistor, the other second electrode of the source and the drain of the second transistor, and the other third electrode of the source and the drain of the third transistor.

6. The semiconductor device according to claim 1, wherein the first semiconductor layer comprises a microcrystalline silicon region.

* * * * *